(12) United States Patent
Liu et al.

(10) Patent No.: US 10,778,214 B1
(45) Date of Patent: Sep. 15, 2020

(54) CIRCUIT STRUCTURE AND POWER-ON METHOD THEREOF

(71) Applicant: REALTEK SEMICONDUCTOR CORP., Hsinchu (TW)

(72) Inventors: Chien-Cheng Liu, Hsinchu County (TW); Yun-Ru Wu, Hsinchu (TW); Yun-Chih Chang, Hsinchu County (TW); Shu-Yi Kao, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/599,356

(22) Filed: Oct. 11, 2019

(30) Foreign Application Priority Data

Mar. 15, 2019 (TW) .............................. 108108989 A

(51) Int. Cl.
*H03K 17/22* (2006.01)
(52) U.S. Cl.
CPC .................................... *H03K 17/22* (2013.01)
(58) Field of Classification Search
CPC ..................................................... H03K 17/22
USPC ......................................................... 327/143
See application file for complete search history.

(56) References Cited

U.S. PATENT DOCUMENTS

| | | | |
|---|---|---|---|
| 2010/0302891 A1* | 12/2010 | Wang .................. | G11C 5/14 365/226 |
| 2012/0175225 A1* | 7/2012 | Breen ................... | B65G 43/10 198/571 |
| 2013/0282191 A1* | 10/2013 | Okuda ..................... | G05F 5/00 700/286 |
| 2016/0363985 A1* | 12/2016 | Ehmann ................ | G06F 1/3287 |
| 2017/0085079 A1* | 3/2017 | Yamane .................. | H02M 1/14 |
| 2018/0032117 A1* | 2/2018 | Leigh ...................... | G06F 1/266 |
| 2019/0165568 A1* | 5/2019 | Adamski ................ | G05F 1/573 |
| 2019/0315480 A1* | 10/2019 | Elliott .................... | B64D 41/00 |

* cited by examiner

*Primary Examiner* — Ryan Jager
(74) *Attorney, Agent, or Firm* — Li & Cai Intellectual Property (USA) Office

(57) ABSTRACT

A circuit structure is electrically connected to a power source. The circuit structure includes a first circuit module and a second circuit module. The first circuit module includes a first module power switch and a plurality of circuits. The first module power switch is electrically connected to the power source. The first circuit module has a first module current. The second circuit module includes a second module power switch and a plurality of circuits. The second power switch is electrically connected to the power source. The second circuit module has a second module current. A turn-on order of the first module power switch and the second power switch is determined based on the first module current and the second module current.

14 Claims, 3 Drawing Sheets

CIRCUIT STRUCTURE AND POWER-ON METHOD THEREOF

CROSS-REFERENCE TO RELATED PATENT APPLICATION

This application claims the benefit of priority to Taiwan Patent Application No. 108108989, filed on Mar. 15, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a circuit structure and a power-on method, and more particularly to a circuit structure and a power-on method that can reduce an inrush current.

BACKGROUND OF THE DISCLOSURE

At present, various types of chipsets are required to set a sleep mode for each circuit of the wafer in response to energy saving standards. However, a large inrush current occurs when the circuit of the wafer is woken up from the sleep mode and the circuit of the chipset can only operate stably after a period of time.

There are two kinds of wake-up methods for circuit power switches in various regions of the chipset. One of the methods is that, the power switches of the circuits are turned on sequentially. The other is that, all of the power switches of the circuit are turned on at the same time. The former method takes a long time for all circuits to wake up, and the latter method has a very large inrush current.

Therefore, providing a power-on method that can reduce the inrush current is an important issue in the industry.

SUMMARY OF THE DISCLOSURE

In response to the above-referenced technical inadequacies, the present disclosure provides a circuit structure. The circuit structure is electrically connected to a power source. The circuit structure includes a first circuit module and a second circuit module. The first circuit module includes a first module power switch and a plurality of circuits. The first module power switch is electrically connected to the power source. The first circuit module has a first module current. The second circuit module includes a second module power switch and a plurality of circuits. The second power switch is electrically connected to the power source. The second circuit module has a second module current. A turn-on order of the first module power switch and the second power switch is determined based on the first module current and the second module current.

In one aspect, the present disclosure provides a circuit structure. The circuit structure is electrically connected to a power source. The circuit structure includes a first circuit module including a first module power switch and a plurality of circuits. The first module power switch is electrically connected to the power source. The first circuit module has a first module current. Each of the circuits includes a current value and a power switch unit electrically connected to the first module power switch. The power switch units of the circuits are turned on based on a predetermined order, and the predetermined order is determined based on magnitudes of the current values of the circuits.

In one aspect, the present disclosure provides a power-on method for a circuit structure. The circuit structure includes a plurality of circuit modules. Each circuit module includes a plurality of circuits. The power-on method includes: providing a power source to the circuit structure; and turning on power switch units of the circuits based on a predetermined order and magnitudes of current values of the circuits of the circuit structure. The predetermined order at least includes: firstly turning on a power switch unit of the circuit corresponding to a first current value of the current values, and then turning on a power switch unit corresponding to a second current value of the current values. The first current value is a maximum current value of the current values, and the second current value is a minimum current value of the current values.

Therefore, the circuit structure, the power-on method, and the power-on planning method provided by the present disclosure can effectively reduce the inrush current, reduce the damage according to turning on of the circuit, and effectively extend the lifetime of the circuit. The present disclosure can further effectively reduce current stable time period and improve the operation efficiency of the circuit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
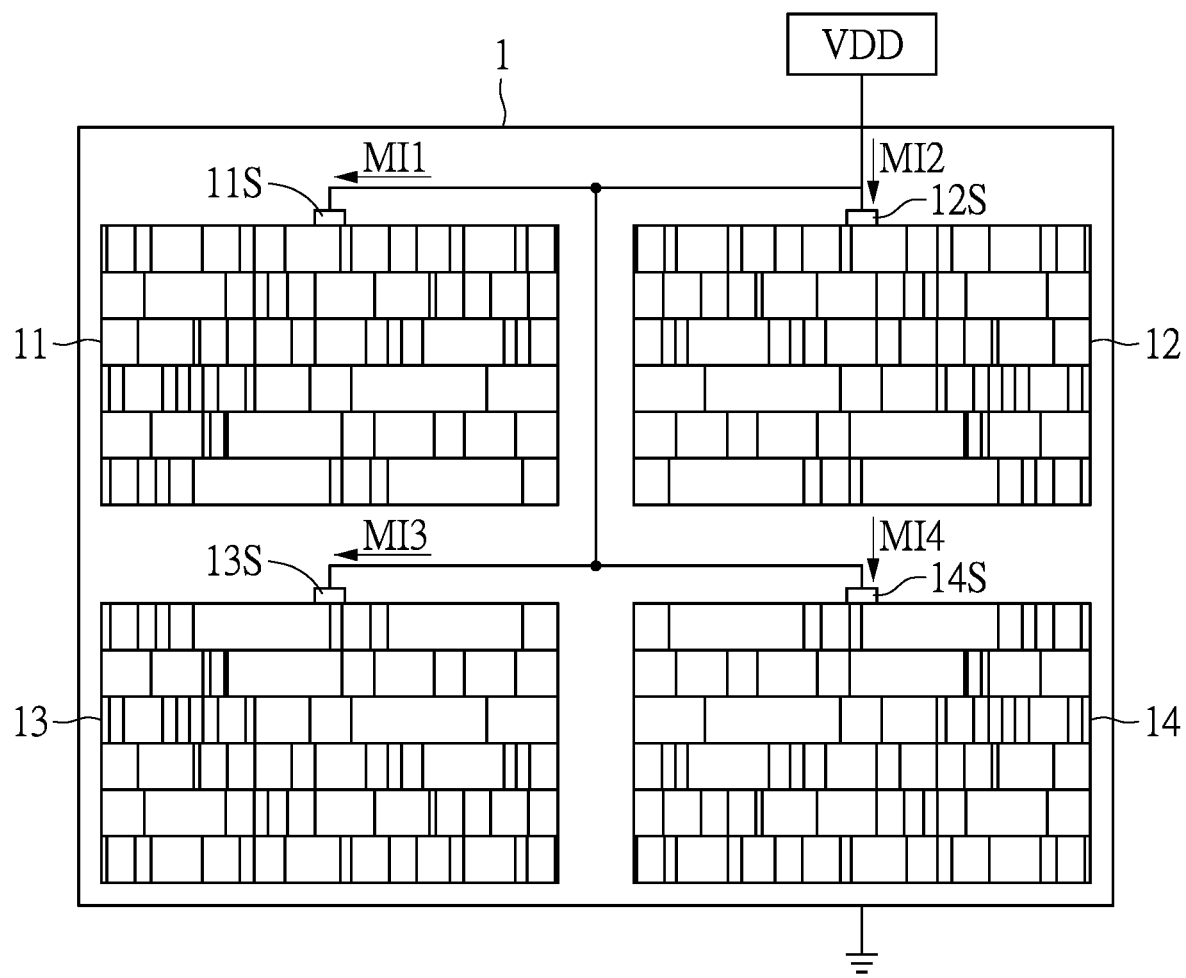
FIG. 1 is a schematic diagram of a circuit structure of a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
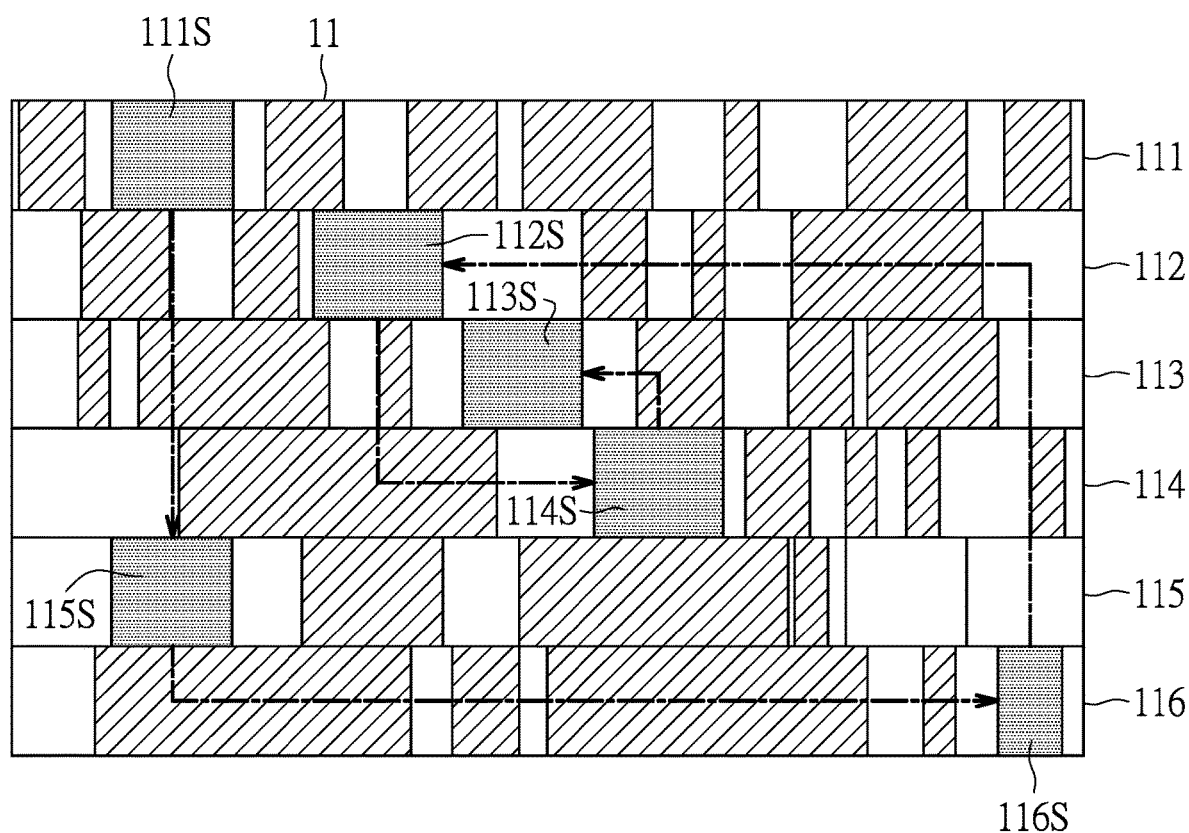
FIG. 2 is a schematic diagram of a circuit module of the first embodiment of the present disclosure.

Referring to FIG. 1 and FIG. 2, FIG. 1 is a schematic diagram of a circuit structure of a first embodiment of the present disclosure, and FIG. 2 is a schematic diagram of a circuit module of the first embodiment of the present disclosure.

A circuit structure 1 is an integrated circuit chip designed by a semiconductor process. The circuit structure 1 includes a first circuit module 11, a second circuit module 12, a third circuit module 13, and a fourth circuit module 14. In the embodiment, each circuit module includes different functions, and the circuit structures are independent from each other.

In the embodiment, the first circuit module 11, the second circuit module 12, the third circuit module 13, and the fourth circuit module 14 respectively include six circuits. The number of circuits included in each circuit module can be adjusted based on actual requirement, which is not limited in the present disclosure.

The first circuit module 11, the second circuit module 12, the third circuit module 13, and the fourth circuit module 14 respectively include a first module power switch 11S and a second module power switch 12S, a third module power switch 13S and a fourth module power switch 14S. The first module power switch 11S, the second module power switch 12S, the third module power switch 13S, and the fourth module power switch 14S are electrically connected to a power source VDD, respectively. The power supply VDD supplies power to the circuit structure 1 to drive the circuit modules 11-14 of the circuit structure 1 for functional operation.

In the embodiment, the power supply VDD respectively provides a first module current MI1, a second module current MI2, a third module current MI3, and a fourth module current MI4 through the first module power switch 11S, the second module power switch 12S, the third module power switch 13S, and the fourth module power switch 14S to the first circuit module 11, the second circuit module 12, the third circuit module 13, and the fourth circuit modules 14.

Since the first circuit module 11, the second circuit module 12, the third circuit module 13, and the fourth circuit module 14 include different active electronic components and passive electronic components. The current values of first module current MI1, the second module current MI2, the third module current MI3, and the fourth module current MI4 may differ from each other.

In the embodiment, in order to reduce an inrush current and a current stable time period, the first module power switch 11S, the second module power switch 12S, and the third module power switch 13S and the fourth module power switch 14S are turned on based on a turn-on order. In the embodiment, the first module power switch 11S, the second module power switch 12S, the third module power switch 13S, and the fourth module power switch 14S are turned on based on magnitudes of the first module current MI1 of the first module power switch 11S, the second module current MI2 of the second module power switch 12S, the third module current MI3 of the third module power switch 13S, and the fourth module current MI4 of the fourth power switch 14S.

In other words, the turn-on order of the first module power switch 11S, the second module power switch 12S, the third module power switch 13S, and the fourth module power switch 14S is determined based on a first predetermined order of the first module current MI1, the second module current MI2, the third module current MI3, and the fourth module current MI4 of the first module power switch 11S, the second module power switch 12S, the third module power switch 13S, and the fourth module power switch 14S.

In the embodiment, the current values of the first module current MI1, the second module current MI2, the third module current MI3, and the fourth module current MI4 are first ordered.

In the embodiment, the first module current MI1 is greater than the second module current MI2. The second module current MI2 is greater than the fourth module current MI4. The fourth module current MI4 is greater than the third module current MI3. In other words, in the embodiment, the maximum current value of the circuit structure 1 is the first module current MI1, and the minimum current value is the third module current MI3.

In the embodiment, the first predetermined order in the circuit structure 1 from the first to the fourth is as follows: the first module current MI1, the third module current MI3, the second module current MI2, and the fourth module current MI4. In other words, the first in the first predetermined order of the circuit structure 1 is the first module current MIL The second in the first predetermined order of circuit structures 1 is the third module current MI3. The third in the first predetermined order of circuit structures 1 is the second module current MI2. The fourth in the first predetermined order of circuit structures 1 is the fourth module current MI4.

The plurality of module power switches 11S-14S of the plurality of circuit modules 11-14 of the circuit structure 1 are sequentially turned on based on the first predetermined order. In other words, the first module power switch 11S corresponding to the first current value (the first module current MI1) in the first predetermined order is first turned on. Then, the third module power switch 13S corresponding to the second current value (the third module current MI3) in the first predetermined order is turned on. Next, the second module power switch 12S corresponding to the third current value (the second module current MI2) in the first predetermined order is turned on. Finally, the fourth module power switch 14S corresponding to the fourth current value (the fourth module current MI4) in the first predetermined order is turned on.

In other words, in the embodiment, the first predetermined order of the circuit modules 11-14 of the circuit structure 1 is, firstly turning on the module power switch of the circuit module having the largest current value, turning on the module power switch of the circuit module having the minimum current value, turning on the module power switch with a larger current value, and then turning on the module power switch with a smaller current value until all the module power switches are turned on.

In the embodiment, the first predetermined order may be designed based on the inrush current and the current stable time period provided by customers, and is not limited in the present disclosure.

Referring to FIG. 2, in the embodiment, each circuit module includes six circuits. The number of circuits included in each circuit module can be adjusted based on actual requirements, but is not limited in the present disclosure. Hereinafter, only the first circuit module 11 will be described, and other circuit modules will not be described.

In the embodiment, the first circuit module 11 includes a first circuit 111, a second circuit 112, a third circuit 113, a fourth circuit 114, a fifth circuit 115, and a sixth circuit 116. In the present embodiment, each of the circuits 111-116 refers to a different circuit structure in a circuit module.

The first circuit 111, the second circuit 112, the third circuit 113, the fourth circuit 114, the fifth circuit 115, and the sixth circuit 116 respectively have a current value, which are a first current value, a second current value, a third current value, a fourth current value, a fifth current value, and a sixth current value.

In the embodiment, the first circuit 111, the second circuit 112, the third circuit 113, the fourth circuit 114, the fifth circuit 115, and the sixth circuit 116 respectively include a first power switch unit 111S, a second power switch unit 112S, a third power switch unit 113S, a fourth power switch unit 114S, a fifth power switch unit 115S, and a sixth power switch unit 116S. The first power switch unit 111S, the second power switch unit 112S, the third power switch unit 113S, the fourth power switch unit 114S, the fifth power switch unit 115S, and the sixth power switch unit 116S are electrically connected to the first module power switch.

In the embodiment, the first current value, the second current value, the third current value, the fourth current value, the fifth current value, and the sixth current value are necessary to be arranged in order by the magnitudes of the current values.

After the current values are arranged in order, the first power switch unit 111S of the first circuit 111, the second power switch unit 112S of the second circuit 112, the third power switch unit 113S of the third circuit 113, and the power switch unit 114S of the fourth circuit 114, the fifth power switch unit 115S of the fifth circuit 115, and the sixth power switch unit 116S of the sixth circuit 116 can be turned on based on a second predetermined order of magnitudes of the current values.

The first predetermined order and the second predetermined order may be the same or different, which are not limited in the present disclosure. In the embodiment, the first predetermined order and the second predetermined order are the same order. In other words, the power switch unit corresponding to the maximum current value is firstly turned on, and then the power switch unit corresponding to the minimum current value is turned on, and then a power switch unit corresponding to a larger current value that is less than the maximum current value is turned on.

In other words, the second turn-on order of the power switch units 111S-116S of the circuits 111-116 of the first circuit module 11 is determined based on the magnitude of a plurality of current values flowing through the plurality of circuits 111-116.

First, a power switch unit of a circuit corresponding to the first current value of a plurality of current values is turned on, and the first current value is the maximum current value of the current values of the circuits 111-116. Next, a power switch unit of a circuit corresponding to the second current value of the plurality of current values is turned on, and the second current value is the minimum current value of the current values of the circuits 111-116.

Next, a power switch unit of the circuit corresponding to the third current value of the plurality of current values is turned on. The third current value is less than the first current value, and the third current value is greater than the second current value. In other words, the power switch unit of the circuit corresponding to the second largest current value is turned on.

Next, the power switch unit of the circuit corresponding to the fourth current value of the plurality of current values is turned on, and the fourth current value is only greater than the second current value. In other words, the fourth current value is only greater than the minimum current value, but smaller than other current values. In other words, the fourth current value is smaller than the first current value and the third current value.

As shown in FIG. 2, the first power switch unit 111S of the first circuit 111 is firstly turned on, and then the fifth power switch unit 115S of the fifth circuit 115 is turned on. Then, the sixth power switch unit 116S of the sixth circuit 116, the second power switch unit 112S of the second circuit 112, the fourth power switch unit 114S of the fourth circuit 114, and the third power switch unit 113S of the third circuit 113 are sequentially turned on.

Based on the second predetermined order, the first current value of the first circuit 111 is the maximum current value. The fifth current value of the fifth circuit 115 is the minimum current value. The order based on the magnitude of the current value is sequentially: the first current value, the sixth current value, the fourth current value, the third current value, the second current value, and the fifth current value.

In the embodiment, the second predetermined order may be designed based on the inrush current and the current stable time period provided by the customer, which is not limited in the present disclosure.

Second Embodiment

Figure 3:
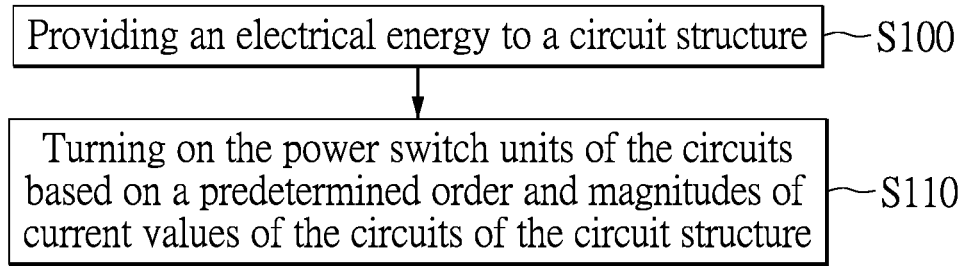
FIG. 3 is a flowchart of a power-on method of a second embodiment of the present disclosure.

Referring to FIG. 3, FIG. 3 is a flowchart of a power-on method of a second embodiment of the present disclosure.

In the embodiment, a power-on method adapted for a circuit structure is provided. The power-on method in the embodiment is applicable to the circuit structure 1 described above. The structure and related functions of the circuit structure 1 previously described are not described in the embodiment.

In the embodiment, the power on method includes the following steps: providing an electrical energy to the circuit structure (step S100); and turning on the power switch units of the plurality of circuits based on a predetermined order and a magnitude of each of the plurality of current values of the plurality of circuits of the circuit structure (step S110).

In step S100, the circuit structure 1 includes at least the plurality of circuits 111-116. The circuit structure 1 is electrically connected to the power supply VDD, and the power supply VDD supplies an electric energy to the circuit structure 1.

In step S110, the predetermined order at least includes: firstly turning on a power switch unit of a circuit corresponding to a first current value of the current values, and then turning on a power switch unit of a circuit corresponding to a second current value the current values. The first current value is a maximum current value of the current values, and the second current value is a minimum current value of the current values.

Furthermore, the power switch unit of the circuit corresponding to a third current value of the current values is turned on. The third current value is only smaller than the first current value, and the third current value is greater than the second current value.

Next, a power switch unit of the circuit corresponding to a fourth current value of the current values is further turned on. The fourth current value is only greater than the second current value, and the fourth current value is less than the first current value and the third current value.

Third Embodiment

Figure 4:
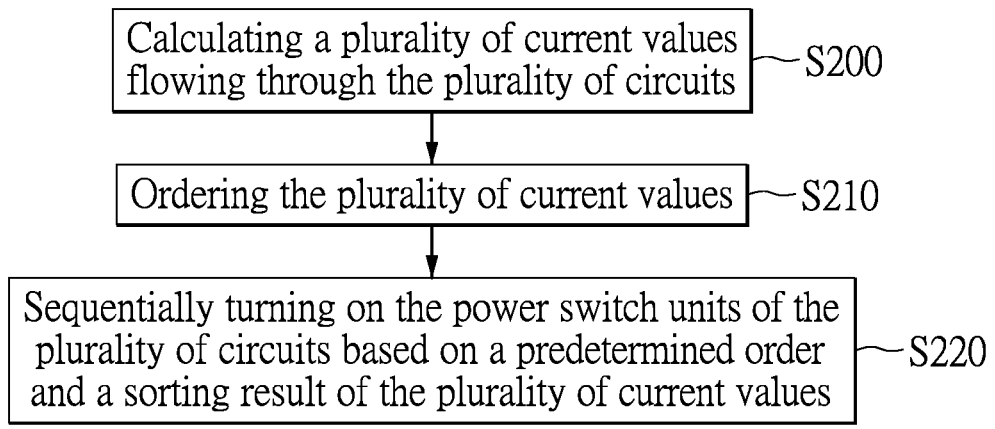
FIG. 4 is a flowchart of a power-on planning method of a third embodiment of the present disclosure.

Referring to FIG. 4, FIG. 4 is a flowchart of a power-on planning method of a third embodiment of the present disclosure.

In the embodiment, a power-on planning method adapted for a circuit structure is provided. The power-on planning method of the embodiment is applicable to the circuit structure 1 described above. The structure and related functions of the circuit structure 1 previously described are not described again in the embodiment.

A power-on planning method suitable for a circuit structure, the circuit structure is electrically connected to a power source, the circuit structure includes a plurality of circuits, and each of the circuits includes a power switch unit. The planning method for opening includes the following steps: calculating a plurality of current values flowing through the plurality of circuits (step S200); ordering the plurality of current values (step S210); and sequentially turning on the plurality of power switch units of the plurality of circuits based on a predetermined order and an ordering result of the plurality of current values (step S220).

In step S200, the circuit structure 1 at least includes a plurality of circuits 111-116. The circuit structure 1 is electrically connected to a power supply VDD, and the power supply VDD supplies an electric energy to the circuit structure 1. The user can pre-calculate the total current flowing through the circuit structure 1 and the current value flowing through the circuits 111-116 through a simulation program.

In step S210, the current values flowing through the respective circuits 111-116 are ordered based on the magnitudes of the current values.

In step S220, the predetermined order at least includes: firstly turning on a power switch unit of a circuit corresponding to a first current value of the current values, and then turning on a power switch unit of the circuit corresponding to a second current value of the current values. The first current value is a maximum current value of the current values, and the second current value is a minimum current value of the current values.

Furthermore, the power switch unit of the circuit corresponding to a third current value of the plurality of current values is turned on. The third current value is only smaller than the first current value, and the third current value is greater than the second current value.

Next, a power switch unit of the circuit corresponding to a fourth current value of the plurality of current values is further turned on. The fourth current value is only greater than the second current value, and the fourth current value is less than the first current value and the third current value.

In conclusion, the circuit structure, the power-on method, and the power-on planning method provided by the present disclosure can effectively reduce the inrush current, reduce the damage from turning on the circuit, and effectively extend the lifetime of the circuit. The present disclosure can further effectively reduce current stable time period and improve the operation efficiency of the circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A circuit structure electrically connected to a power source, and the circuit structure comprising:
   a first circuit module including a first module power switch and a plurality of circuits, wherein the first module power switch is electrically connected to the power source, and the first circuit module has a first module current; and
   a second circuit module including a second module power switch and a plurality of circuits, wherein the second power switch is electrically connected to the power source, and the second circuit module has a second module current;
   wherein a turn-on order of the first module power switch and the second power switch is determined based on the first module current and the second module current;
   wherein the plurality of the circuits of the first circuit module respectively include a power switch unit, and the power switch units are electrically connected the first module power switch, and a turn-on order of the power switch units of the first circuit module is determined based on magnitudes of the currents flowing through the plurality of circuits.

2. The circuit structure of claim 1, wherein the turn-on order of the first module power switch and the second module power switch is determined based on a first predetermined order of the first module current and the second module current.

3. The circuit structure of claim 2, wherein the circuits of the second circuit module respectively include a power switch unit, the power switch units of the circuits of the second circuit module are electrically connected to the second power switch, and a turn-on order of the power switch units of the circuit of the second circuit module is determined based on a second predetermined order of current values flowing through the circuits.

4. The circuit structure of claim 1, wherein the plurality of circuits respectively includes a current value, a power switch unit of the circuit corresponding to a first current value of the current values is firstly turned on, and then a power switch unit of the circuit corresponding to a second current value of the current values is turned on, the first current value is a maximum current value of the current values, and the second current value is a minimum current value of the current values.

5. The circuit structure of claim 4, wherein a power switch unit of the circuit corresponding to a third current value of the plurality of current values is turned on, the third current value is only less than the first current value, and the third current value is greater than the second current value.

6. The circuit structure of claim 5, wherein a power switch unit of the circuit corresponding to a fourth current value of the plurality of current values is turned on, the fourth current value is only greater than the second current value, and the fourth current value is less than the first current value and the third current value.

7. The circuit structure of claim 1, wherein the power source supplies an electrical energy to the circuit structure.

8. A circuit structure electrically connected to a power source, the circuit structure comprising:
a first circuit module including a first module power switch and a plurality of circuits, wherein the first module power switch is electrically connected to the power source, the first circuit module has a first module current, each of the circuits includes a current value, and a power switch unit electrically connected to the first module power switch;
wherein the power switch units of the circuits are turned on based on a predetermined order, and the predetermined order is determined based on magnitude of the current values of the circuits;
wherein the power switch unit of the circuit corresponding to a first current value of the plurality of current values is firstly turned on, and then a power switch unit of the circuit corresponding to a second current value of the plurality of current values is turned on, the first current value is a maximum current value of the plurality of current values, and the second current values is a minimum current value of the current values.

9. The circuit structure of claim 8, wherein the predetermined order of the power switch units is determined based on a magnitude order of the current values of the circuits.

10. The circuit structure of claim 8, wherein the power switch unit of the circuit corresponding to a third current value of the plurality of current values is turned on, the third current value is only less than the first current value, and the third current value is greater than the second current value.

11. The circuit structure of claim 10, wherein the power switch unit of the circuit corresponding to a fourth current value of the current values is turned on, the fourth current value is only greater than the second current value, and the fourth current value is less than the first current value and the third current value.

12. A power-on method for a circuit structure, wherein the circuit structure includes a plurality of circuit modules, and each circuit module includes a plurality of circuits, the power-on method comprising:
providing a power source to the circuit structure; and
turning on power switch units of the circuits based on a predetermined order and magnitudes of current values of the circuits of the circuit structure;
wherein the predetermined order at least includes: firstly turning on a power switch unit of the circuit corresponding to a first current value of the current values, and then turning on a power switch unit corresponding to a second current value of the current values; wherein the first current value is a maximum current value of the current values, and the second current value is a minimum current value of the current values.

13. The power-on method of claim 12, wherein the power switch unit of the circuit corresponding to a third current value of the current values is turned on after the power switch unit of the circuit corresponding to the second current value is turned on, the third current value is only less than the first current value, and the third current value is greater than the second current value.

14. The power-on method based on claim 13, wherein the power switch unit of the circuit corresponding to a fourth current value of the current values is turned on after the power switch unit corresponds to a third current value is turned on, the fourth current value is only greater than the second current value, and the fourth current value is less than the first current value and the third current values.

* * * * *